US012356639B2

(12) United States Patent
Liu

(10) Patent No.: US 12,356,639 B2
(45) Date of Patent: Jul. 8, 2025

(54) DOUBLE-SIDED STACKED DTC STRUCTURE

(71) Applicant: Taiwan Semiconductor Manufacturing Company, Ltd., Hsinchu (TW)

(72) Inventor: Ming Chyi Liu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/353,246

(22) Filed: Jul. 17, 2023

(65) Prior Publication Data

US 2023/0361224 A1 Nov. 9, 2023

Related U.S. Application Data

(62) Division of application No. 17/412,622, filed on Aug. 26, 2021, now Pat. No. 11,869,988.

(51) Int. Cl.

| | |
|---|---|
| ***H10D 1/66*** | (2025.01) |
| ***H01L 23/31*** | (2006.01) |
| ***H01L 23/522*** | (2006.01) |
| ***H01L 23/532*** | (2006.01) |
| ***H10D 1/00*** | (2025.01) |
| ***H10D 1/68*** | (2025.01) |

(52) U.S. Cl.

CPC ......... *H10D 1/665* (2025.01); *H01L 23/3157* (2013.01); *H01L 23/5226* (2013.01); *H01L 23/53209* (2013.01); *H10D 1/047* (2025.01); *H10D 1/692* (2025.01)

(58) Field of Classification Search

None

See application file for complete search history.

(56) References Cited

U.S. PATENT DOCUMENTS 10,991,793 B2 * 4/2021 Lu .......................... H10D 1/043
2012/0181661 A1 7/2012 Booth, Jr. et al.

(Continued)

FOREIGN PATENT DOCUMENTS

CN 112151535 A * 12/2020 ......... H01L 21/8221

OTHER PUBLICATIONS

English translation of CN 112151535 A (Year: 2020).*

(Continued)

*Primary Examiner* — Khaja Ahmad

(74) *Attorney, Agent, or Firm* — Eschweiler & Potashnik, LLC

(57) ABSTRACT

In some embodiments, the present disclosure relates to an integrated circuit (IC), including a first insulating layer which includes a first metal interconnect structure stacked above a bottom die. Including a substrate disposed above the first insulating layer, a second metal interconnect structure disposed above the substrate, a through-substrate via (TSV) directly connecting the first metal interconnect structure to the second metal interconnect structure, and a stacked deep trench capacitor (DTC) structure disposed in the substrate. The DTC structure includes a first plurality of trenches extending from a first side of the substrate and a second plurality of trenches extending from a second side of the substrate.

20 Claims, 11 Drawing Sheets

(56) References Cited

U.S. PATENT DOCUMENTS

| | | | | |
|---|---|---|---|---|
| 2014/0035158 | A1* | 2/2014 | Chang | H01L 24/08 438/109 |
| 2017/0053979 | A1 | 2/2017 | Voiron et al. | |
| 2019/0164905 | A1* | 5/2019 | Hsieh | H01L 23/5383 |
| 2019/0348496 | A1* | 11/2019 | Murase | H01G 4/236 |
| 2020/0091063 | A1 | 3/2020 | Chen et al. | |
| 2021/0005393 | A1* | 1/2021 | Lu | H10D 1/716 |
| 2021/0005707 | A1* | 1/2021 | Lu | H10D 1/716 |
| 2021/0159187 | A1 | 5/2021 | Hsieh et al. | |
| 2022/0028782 | A1* | 1/2022 | Hosogai | H01L 27/14603 |

OTHER PUBLICATIONS

Non-Final Office Action dated Jan. 19, 2023 for U.S. Appl. No. 17/412,622.

Notice of Allowance dated May 8, 2023 for U.S. Appl. No. 17/412,622.

* cited by examiner

DOUBLE-SIDED STACKED DTC STRUCTURE

REFERENCE TO RELATED APPLICATION

This application is a Divisional of U.S. application Ser. No. 17/412,622, filed on Aug. 26, 2021, the contents of which are hereby incorporated by reference in their entirety.

BACKGROUND

The integrated circuit (IC) manufacturing industry has experienced exponential growth recently. The evolution of ICs has led to an increase in functional density and a decrease in geometrical size. A deep trench capacitor (DTC) is one feature that can be found on ICs and comprises one or more trenches within a substrate. DTCs are used to add capacitance to various ICs. As technology is developed to be smaller and more efficient, manufacturing methods often need to be adjusted to accommodate for the smaller dimensions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
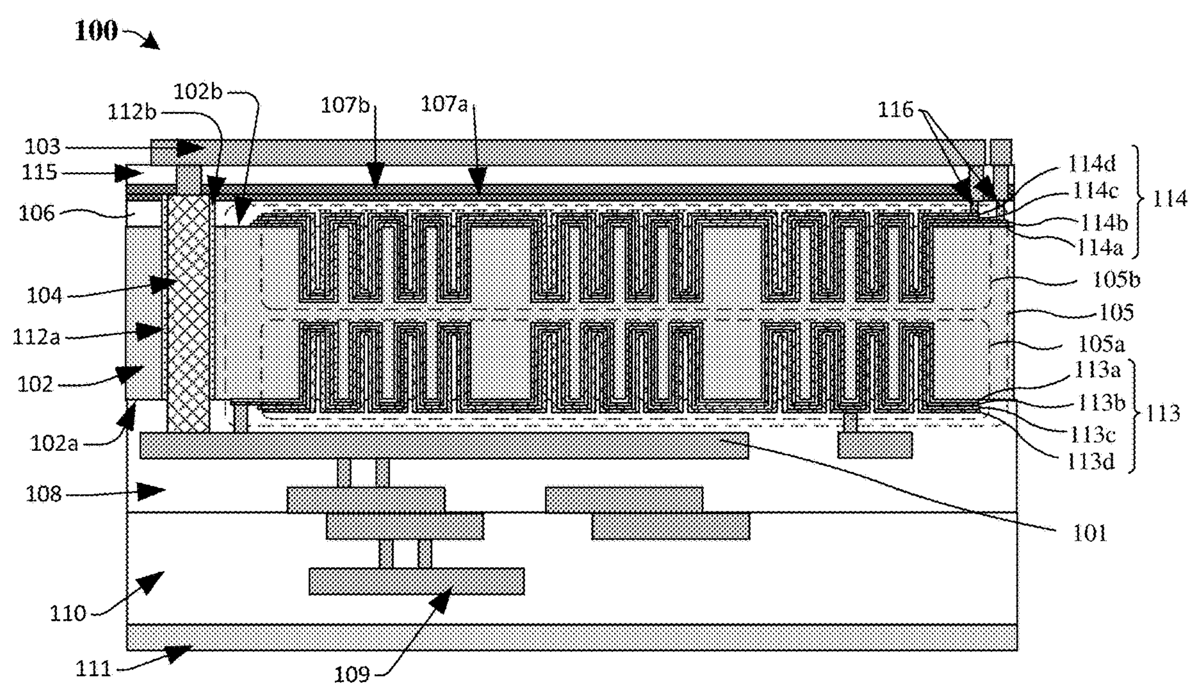
FIG. 1 illustrates a cross-sectional view of some embodiments of an IC comprising a stacked deep trench capacitor structure in a single substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A deep trench capacitor (DTC) comprises one or more trenches within a substrate. Each trench of the one or more trenches comprises a DTC stack comprising an outer electrode, an inner electrode, and a dielectric layer separating the inner and outer electrodes. DTCs are used to add capacitance to various integrated circuits. As technology is developed to be smaller and more efficient, manufacturing methods often need to be adjusted to accommodate for the smaller dimensions.

Typically, a DTC structure may be formed by etching trenches into two separate wafers. The DTC stack is then deposited in each trench. A frontside of each wafer is temporarily bonded to a glass structure, and a backside of each wafer is then thinned down. The two wafers are then bonded backside to backside using a bonding layer, such that there are one or more upper trenches stacked above one or more lower trenches. Then, the DTC structure is embedded in a packaging substrate. The packaging substrate is attached to a die by solder bumps.

The methodology behind DTC structure formation is complex and expensive. To form the DTC structure, two separate wafers have trenches etched into them and a DTC stack formed within them. After this, both wafers have to undergo a thin down process and then they are bonded together. Providing two separate wafers and performing two trim down processes is cost ineffective. Although stacking a layer of upper trenches above a layer of bottom trenches increases capacitance, because two separate wafers are bonded together, the DTC structure must be embedded in the package substrate. Due to the size of the connecting solder bumps, a distance between the DTC structure and the attached die can exceed 600 um, and this large distance causes an equivalent series resistance of the structure to also be large. Embedding the DTC structure in the package substrate has a negative impact on the equivalent series resistance of the structure.

In the present disclosure, a new method of manufacturing DTC structures is presented to produce more cost effective and efficient integrated circuits. The new manufacturing method forms a layer of upper trenches and a layer of lower trenches within a single wafer. A through-substrate via (TSV) is used to connect the attached die to each side of the DTC structure, allowing the single-wafer structure to be embedded within the die itself. Further, the single wafer process requires only a single thin down process. This single layer structure can also reduce the equivalent series resistance compared to DTCs that utilize two separate substrates, and thereby provides enhanced functionality compared to DTCs on two separate substrates.

FIG. 1 illustrates a cross-sectional view 100 of some embodiments of an IC comprising a stacked deep trench capacitor structure. The IC comprises a first insulating layer 108 comprising a metal interconnect structure 101 stacked above a die 111. A semiconductor substrate 102 is disposed above the first insulating layer 108. The semiconductor substrate 102 comprises a DTC structure 105 comprising a first plurality of trenches 105*a* extending from a first side of the semiconductor substrate 102 and a second plurality of trenches 105*b* extending from a second side of the semiconductor substrate 102. Each trench of the first plurality of trenches 105*a* comprises a first DTC stack 113 configured to provide the IC with a capacitance, the first DTC stack 113 comprising a first inner dielectric layer 113*a* directly contacting the semiconductor substrate 102, a first inner electrode 113*b*, a first capacitor dielectric 113*c*, and a first outer electrode 113*d*. The first capacitor dielectric 113*c* separates the first inner electrode 113*b* from the first outer electrode 113*d*, and the first inner dielectric layer 113*a* separates the first inner electrode 113*b* from the semiconductor substrate 102. Each trench of the second plurality of trenches 105*b* comprises a second DTC stack 114 configured to provide the IC with a capacitance, the second DTC stack 114 comprising a second inner dielectric layer 114*a* directly contacting the semiconductor substrate 102, a second inner electrode 114*b*, a second capacitor dielectric 114*c*, and a second outer electrode 114*d*. The second capacitor dielectric 114*c* separates the second inner electrode 114*b* from the second outer electrode 114*d*, and the second inner dielectric layer 114*a* separates the second inner electrode 114*b* from the semiconductor substrate 102. In some embodiments, the DTC structure 105 may be less than 30 um away from the die 111. In some embodiments, the first DTC stack 113 and the second DTC stack 114 may comprise additional metal layers and additional insulating layers, such that an insulating layer separates each metal layer. In some embodiments, the first inner electrode 113*b* and the second inner electrode 114*b* may each have a first thickness ranging from 10 Angstroms to 1000 Angstroms. In some embodiments, the first outer electrode 113*d* and the second outer electrode 114*d* may each have a second thickness ranging from 10 Angstroms to 1000 Angstroms. In some embodiments, the first inner dielectric layer 113*a* and the second inner dielectric layer 114*a* may each have a third thickness ranging from 5 Angstroms to 500 Angstroms. In some embodiments, the first capacitor dielectric 113*c* and the second capacitor dielectric 114*c* may each have a fourth thickness ranging from 5 Angstroms to 500 Angstroms.

The semiconductor substrate 102 may be or otherwise comprise, for example, a bulk silicon substrate, a bulk germanium substrate, a group III-V substrate, or some other suitable semiconductor substrate. The first inner electrode 113*b*, the first outer electrode 113*d*, the second inner electrode 114*b*, and the second outer electrode 114*d* may be or otherwise comprise, for example, doped polysilicon, metal, or some other suitable conductive material(s). The first inner dielectric layer 113*a*, the second inner dielectric layer 114*a*, and the first insulating layer 108 may be or otherwise comprise, for example, silicon dioxide, silicon nitride, some other suitable low-k dielectric(s), or any combination of the foregoing. The first capacitor dielectric 113*c* and the second capacitor dielectric 114*c* may be or otherwise comprise, for example, hafnium silicate, zirconium dioxide, hafnium dioxide, some other suitable high-k dielectric(s), or any combination of the foregoing.

An inter-layer dielectric (ILD) 106 is disposed over the DTC structure 105 and the semiconductor substrate 102. In some embodiments, a first encapsulation layer 107*a* is disposed directly over the ILD 106, and a second encapsulation layer 107*b* is disposed over the first encapsulation layer 107*a*. A metal interconnect structure 103 is stacked above the semiconductor substrate 102 such that it directly contacts a top surface of the DTC structure 105 and serves as a redistribution layer. A through-substrate via (TSV) 104 electrically couples the metal interconnect structure 101 to the metal interconnect structure 103, such that the TSV 104 extends vertically past opposing surfaces of the semiconductor substrate 102. The second encapsulation layer 107*b* seals a top surface of the TSV 104, preventing exposure of the TSV 104. In some embodiments, the first encapsulation layer 107*a* contacts outer sidewalls of the TSV 104, preventing exposure of the TSV 104. In some embodiments, the top surface of the TSV 104 is above a bottom surface of the first encapsulation layer 107*a*. Isolation structures 112*a* and 112*b* directly contact opposing outer sidewalls of the TSV 104 and laterally separate the TSV 104 from the semiconductor substrate 102. The metal interconnect structure 101 is directly coupled to the first DTC stack 113, and the metal interconnect structure 103 is directly coupled to the second DTC stack 114 by connecting vias 116. In some embodiments, a second insulating layer 110 comprises a metal interconnect structure 109 and separates the first insulating layer 108 from the die 111. In some embodiments, a third insulating layer 115 is disposed directly over the second encapsulation layer 107*b*. In some embodiments, the DTC structure 105 has a thickness ranging from 1 um to 500 um.

The metal interconnect structure 101, the metal interconnect structure 103, the metal interconnect structure 109, connecting vias 116, and the TSV 104 are conductive and may be or otherwise comprise, for example, tungsten, aluminum copper, copper, aluminum, some other suitable metal (s), or some other suitable conductive material(s). The ILD 106, the first encapsulation layer 107*a*, the second encapsulation layer 107*b* the second insulating layer 110, and the third insulating layer 115 may be or otherwise comprise, for example, silicon dioxide, silicon nitride, silicon carbide, some other suitable dielectric(s), or any combination of the foregoing. The isolation structures 112*a* and 112*b* may be or otherwise comprise, for example, undoped silicate glass, phosphosilicate glass, borophosophosilicate glass, some other suitable dielectric(s), or any combination of the foregoing.

The methodology behind the formation of previous DTC structures is complex and expensive. In order to have an optimized capacitance, the DTC structure may be vertically stacked. To vertically stack the DTC structure, the methodology may require the DTC structure to be greater than 600 um away from a die. The greater the distance between the die and the DTC structure, the greater the equivalent series resistance of the IC, causing a voltage of the IC to be more unstable. FIG. 1 illustrates a DTC structure 105 formed with a single semiconductor substrate 102. Compared to previous DTC structures that are stacked on two different substrates and which may be such more than 600 um away from a die, the DTC structure 105 is cheaper and simpler. Further, the DTC structure 105 may be less than 30 um away from the die 111, reducing equivalent series resistance and therefore increasing voltage stability of the IC.

Figure 2:
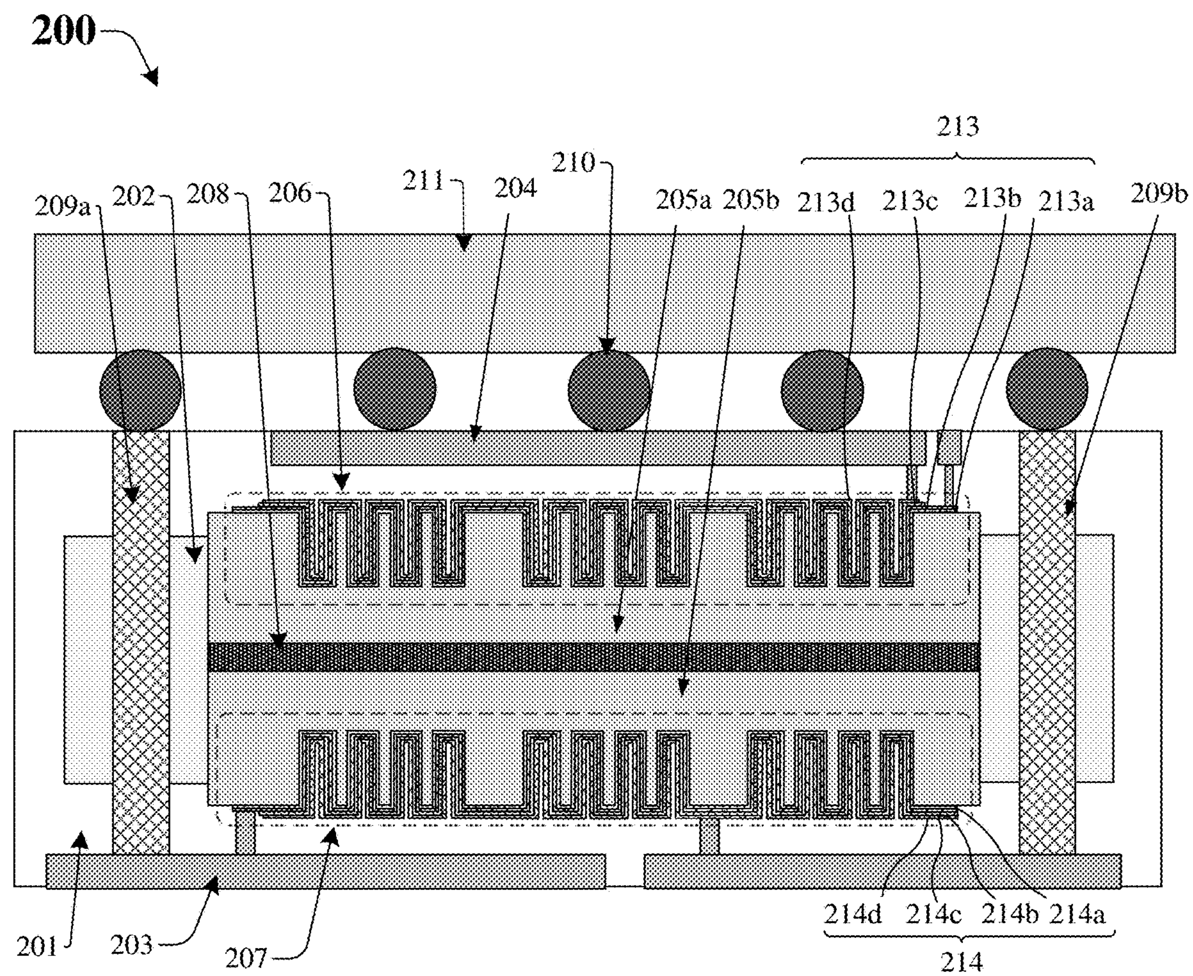
FIGS. 2 and 3 illustrate cross-sectional views of some additional embodiments of an IC comprising a stacked deep trench capacitor structure using a plurality of substrates.

FIG. 2 illustrates a cross sectional view 200 of some embodiments of an IC comprising a stacked deep trench capacitor structure. The IC comprises a package substrate 202 surrounded by a first insulating structure 201. A first semiconductor substrate 205*a* is disposed laterally between inner sidewalls of the package substrate 202. The first semiconductor substrate 205*a* comprises a first plurality of trenches 206 extending from an upper surface of the first semiconductor substrate 205*a*. Each trench of the first plurality of trenches 206 comprises a first DTC stack 213 configured to provide the IC with a capacitance, the first DTC stack 213 comprising a first inner dielectric layer 213*a* directly contacting the first semiconductor substrate 205*a*, a first inner electrode 213*b*, a first capacitor dielectric 213*c*, and a first outer electrode 213*d*. The first capacitor dielectric 213*c* separates the first inner electrode 213*b* from the first outer electrode 213*d*, and the first inner dielectric layer 213*a* separates the first inner electrode 213*b* from the first semiconductor substrate 205*a*. A second semiconductor substrate 205*b* is disposed laterally between inner sidewalls of the package substrate 202 and directly below the first semiconductor substrate 205*a*. The second semiconductor substrate 205*b* comprises a second plurality of trenches 207 extending from a lower surface of the second semiconductor substrate 205*b*. Each trench of the second plurality of trenches 207 comprises a second DTC stack 214 configured to provide the IC with a capacitance, the second DTC stack 214 comprising a second inner dielectric layer 214*a* directly contacting the second semiconductor substrate 205*b*, a second inner electrode 214*b*, a second capacitor dielectric 214*c*, and a second outer electrode 214*d*. The second capacitor dielectric 214*c* separates the second inner electrode 214*b* from the second outer electrode 214*d*, and the second inner dielectric layer 214*a* separates the second inner electrode 214*b* from the second semiconductor substrate 205*b*. In some embodiments, a lower surface of the first semiconductor substrate 205*a* is bonded to the upper surface of the second semiconductor substrate 205*b* by a bonding layer 208.

The first semiconductor substrate 205*a* and the second semiconductor substrate 205*b* may be or otherwise comprise, for example, a bulk silicon substrate, a bulk germanium substrate, a group III-V substrate, or some other suitable semiconductor substrate. The first inner electrode 213*b*, the first outer electrode 213*d*, the second inner electrode 214*b*, and the second outer electrode 214*d* may be or otherwise comprise, for example, doped polysilicon, metal, or some other suitable conductive material(s). The first inner dielectric layer 213*a*, the second inner dielectric layer 214*a*, and the first insulating structure 201 may be or otherwise comprise, for example, silicon dioxide, silicon nitride, some other suitable low-k dielectric(s), or any combination of the foregoing. The first capacitor dielectric 213*c* and the second capacitor dielectric 214*c* may be or otherwise comprise, for example, hafnium silicate, zirconium dioxide, hafnium dioxide, some other suitable high-k dielectric(s), or any combination of the foregoing. The package substrate 202 may be or otherwise comprise, for example, ceramic, epoxy, or another suitable packaging material. The bonding layer 208 may be or otherwise comprise, for example, an epoxy-based negative photoresist, benzocyclobutene (BCB), or another suitable adhesive.

The first insulating structure 201 comprises a metal interconnect structure 203 electrically coupled to the first DTC stack 213. In some embodiments, the metal interconnect structure 203 is entirely below the package substrate 202. The first insulating structure 201 further comprises a metal interconnect structure 204 serving as a redistribution layer electrically coupled to the second DTC stack 214. In some embodiments, the metal interconnect structure 204 is entirely above the package substrate 202. A plurality of solder balls 210 electrically couple the metal interconnect structure 204 to a die 211. TSV 209*a* and TSV 209*b* extend through the package substrate 202 and electrically couple the metal interconnect structure 203 to the solder balls 210. The metal interconnect structure 203 is directly coupled to the second DTC stack 214, and the metal interconnect structure 204 is directly coupled to the second DTC stack 214.

The metal interconnect structure 203, the metal interconnect structure 204, the TSV 209*a*, the TSV 209*b*, and the solder balls 210 are conductive and may be or otherwise comprise, for example, tungsten, aluminum copper, copper, aluminum, some other suitable metal(s), or some other suitable conductive material(s).

Figure 3:
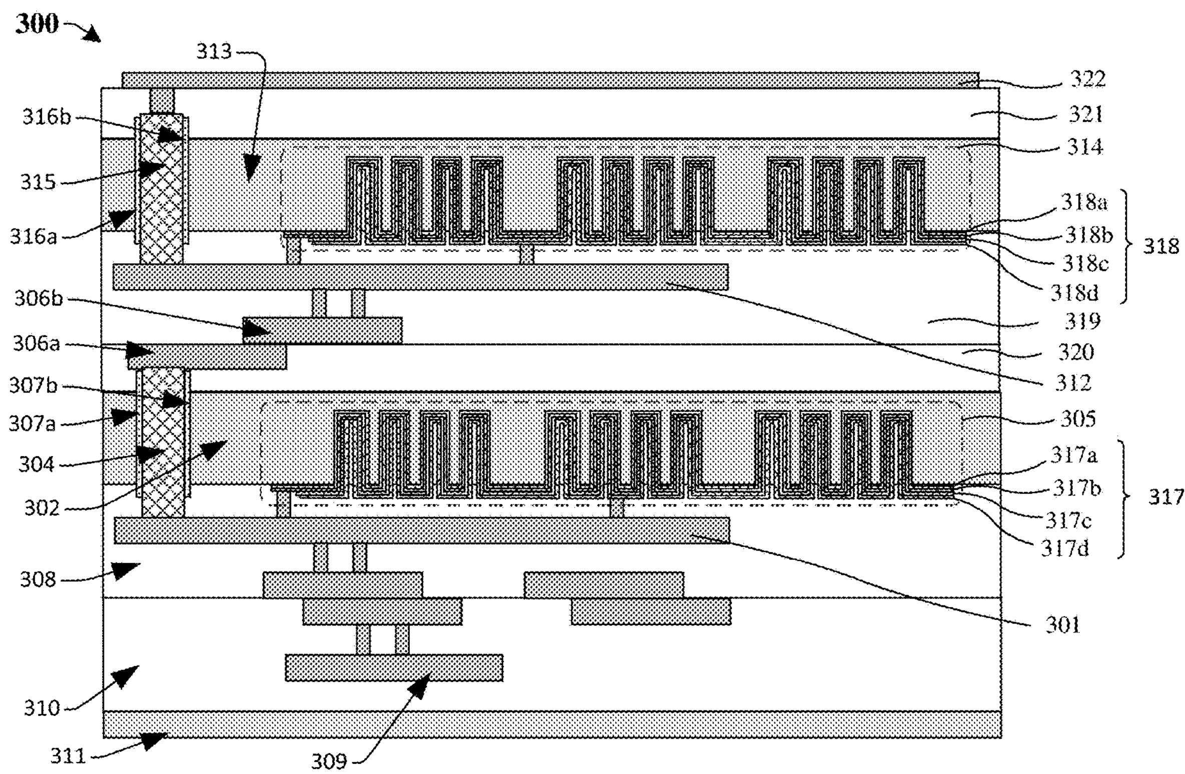

FIG. 3 illustrates a cross sectional view 300 of some embodiments of an IC comprising a stacked deep trench capacitor structure. The IC comprises a first insulating layer 308 comprising a metal interconnect structure 301 stacked above a die 311. A first semiconductor substrate 302 is disposed above the first insulating layer 308. The first semiconductor substrate 302 comprises a first plurality of trenches 305 extending from a lower surface of the first semiconductor substrate 302. Each trench of the first plurality of trenches 305 comprises a first DTC stack 317 configured to provide the IC with a capacitance, the first DTC stack 317 comprising a first inner dielectric layer 317*a* directly contacting the first semiconductor substrate 302, a first inner electrode 317*b*, a first capacitor dielectric 317*c*, and a first outer electrode 317*d*. The first capacitor dielectric 317*c* separates the first inner electrode 317*b* from the first outer electrode 317*d*, and the first inner dielectric layer 317*a* separates the first inner electrode 317*b* from the first semiconductor substrate 302. A first inter-layer dielectric (ILD) 320 is disposed over the first semiconductor substrate 302 and comprises a first redistribution layer 306*a*. A first through-substrate via (TSV) 304 electrically couples the metal interconnect structure 301 to the first redistribution layer 306*a*, such that the first TSV 304 extends vertically past opposing surfaces of the first semiconductor substrate 302. A first pair of isolation structures 307*a* and 307*b* directly contact opposing outer sidewalls of the first TSV 304 and laterally separate the first TSV 304 from the first semiconductor substrate 302.

A second insulating layer 319 is disposed directly above the first ILD 320 and comprises a second redistribution layer 306*b* electrically coupled to the first redistribution layer 306*a*. The second insulating layer 319 further comprises a metal interconnect structure 312 electrically coupled to the second redistribution layer 306*b*. A second semiconductor substrate 313 is disposed above the second insulating layer 319. The second semiconductor substrate 313 comprises a second plurality of trenches 314 extending from a lower surface of the second semiconductor substrate 313. Each trench of the second plurality of trenches 314 comprises a second DTC stack 318 configured to provide the IC with a capacitance, the second DTC stack 318 comprising a second inner dielectric layer 318*a* directly contacting the second semiconductor substrate 313, a second inner electrode 318*b*, a second capacitor dielectric 318*c*, and a second outer electrode 318*d*. The second capacitor dielectric 318*c* separates the second inner electrode 318*b* from the second outer electrode 318*d*, and the second inner dielectric layer 318*a* separates the second inner electrode 318*b* from the second semiconductor substrate 313. A second inter-layer dielectric (ILD) 321 is disposed over the second semiconductor substrate 313 and comprises a metal interconnect structure 322 that serves as a redistribution layer. A second TSV 315 electrically couples the metal interconnect structure 312 to the metal interconnect structure 322, such that the second TSV 315 extends vertically past opposing surfaces of the second semiconductor substrate 313. A second pair of isolation structures 316*a* and 316*b* directly contact opposing outer sidewalls of the second TSV 315 and laterally separate the second TSV 315 from the second semiconductor substrate 313. The metal interconnect structure 301 is directly coupled to the first DTC stack 317, and the metal interconnect structure 312 is directly coupled to the second DTC stack 318. In some embodiments, a third insulating layer 310 comprising a metal interconnect structure 309 separates the first insulating layer 308 from the die 311.

The first semiconductor substrate 302 and the second semiconductor substrate 313 may be or otherwise comprise, for example, a bulk silicon substrate, a bulk germanium substrate, a group III-V substrate, or some other suitable semiconductor substrate. The first inner electrode 317*b*, the first outer electrode 317*d*, the second inner electrode 318*b*, and the second outer electrode 318*d* may be or otherwise comprise, for example, doped polysilicon, metal, or some other suitable conductive material(s). The first inner dielectric layer 317*a*, the second inner dielectric layer 318*a*, the second insulating layer 319, the third insulating layer 310, the first ILD 320, the second ILD 321, and the first insulating layer 308 may be or otherwise comprise, for example, silicon dioxide, silicon nitride, some other suitable low-k dielectric(s), or any combination of the foregoing. The first capacitor dielectric 317*c* and the second capacitor dielectric 318*c* may be or otherwise comprise, for example, hafnium silicate, zirconium dioxide, hafnium dioxide, some other suitable high-k dielectric(s), or any combination of the foregoing. The metal interconnect structure 301, the metal interconnect structure 312, the metal interconnect structure 322, the first TSV 304, the second TSV 315, the first redistribution layer 306*a*, and the second redistribution layer 306*b* are conductive and may be or otherwise comprise, for example, tungsten, aluminum copper, copper, aluminum, some other suitable metal(s), or some other suitable conductive material(s). The first pair of isolation structures 307*a* and 307*b* and the second pair of isolation structures 316*a* and 316*b* may be or otherwise comprise, for example, an oxide (e.g. silicon dioxide), some other suitable dielectric(s), or any combination of the foregoing.

Figure 4:
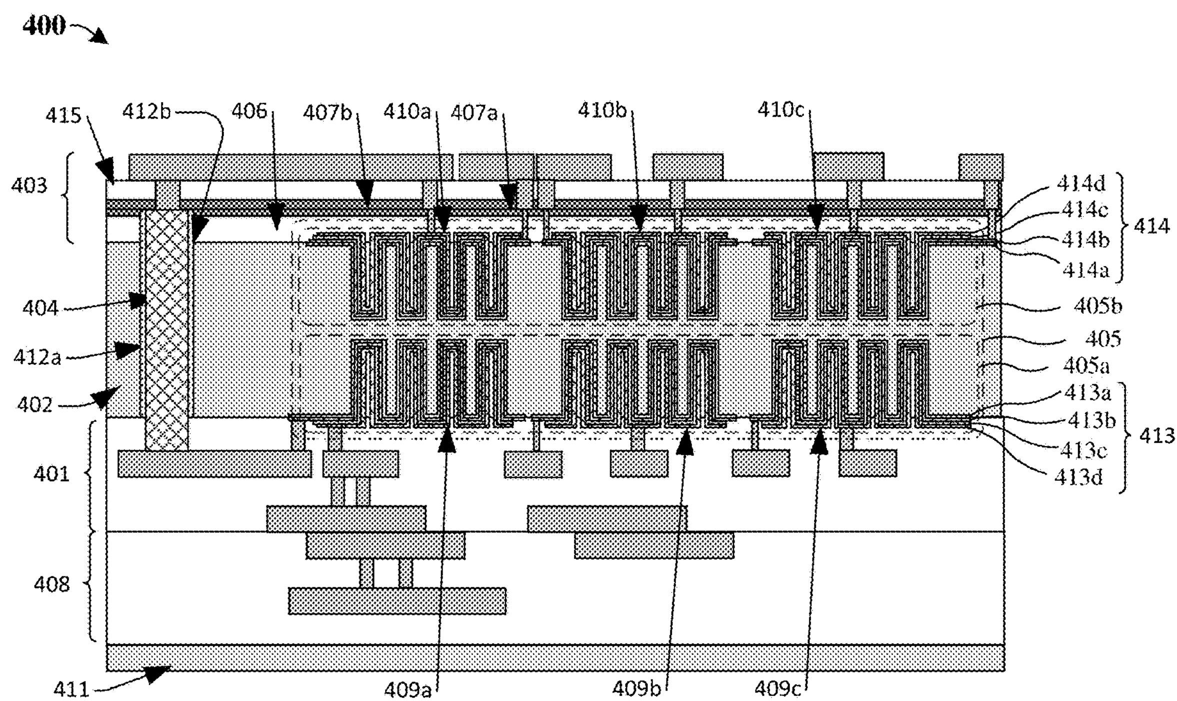
FIG. 4 illustrates a cross-sectional view of some additional embodiments of an IC comprising a stacked deep trench capacitor structure in a single substrate.

FIG. 4 illustrates a cross sectional view 400 of some embodiments of an IC comprising a stacked deep trench capacitor structure. The IC comprises a metal interconnect layer 401 stacked above a die 411. A semiconductor substrate 402 is disposed above the metal interconnect layer 401. The semiconductor substrate 402 comprises a DTC structure 405 comprising a first plurality of trenches 405*a* extending from a first side of the semiconductor substrate 402 and a second plurality of trenches 405*b* extending from a second side of the semiconductor substrate 402. The first plurality of trenches 405*a* are separated into one or more lower groups (e.g. first lower group 409*a*, second lower group 409*b*, and third lower group 409*c*) of one or more trenches, and the second plurality of trenches 405*b* are separated into one or more upper groups (e.g. first upper group 410*a*, second upper group 410*b*, and third upper group 410*c*) of one or more trenches. Each lower group (e.g. first lower group 409*a*, second lower group 409*b*, and third lower group 409*c*) of the first plurality of trenches 405*a* comprises a first DTC stack 413 configured to provide the IC with a capacitance, the first DTC stack 413 comprising a first inner dielectric layer 413*a* directly contacting the semiconductor substrate 402, a first inner electrode 413*b*, a first capacitor dielectric 413*c*, and a first outer electrode 413*d*. The first capacitor dielectric 413*c* separates the first inner electrode 413*b* from the first outer electrode 413*d*, and the first inner dielectric layer 413*a* separates the first inner electrode 413*b* from the semiconductor substrate 402. The first DTC stack 413 of each lower group (e.g. first lower group 409*a*, second lower group 409*b*, and third lower group 409*c*) of the first plurality of trenches 405*a* is laterally and electrically isolated from the first DTC stack 413 of each other lower group, such that each lower group can represent a separate capacitor structure. Each upper group (e.g. first upper group 410*a*, second upper group 410*b*, and third upper group 410*c*) of the second plurality of trenches 405*b* comprises a second DTC stack 414 configured to provide the IC with a capacitance, the second DTC stack 414 comprising a second inner dielectric layer 414*a* directly contacting the semiconductor substrate 402, a second inner electrode 414*b*, a second capacitor dielectric 414*c*, and a second outer electrode 414*d*. The second capacitor dielectric 414*c* separates the second inner electrode 414*b* from the second outer electrode 414*d*, and the second inner dielectric layer 414*a* separates the second inner electrode 414*b* from the semiconductor substrate 402. The second DTC stack 414 of each upper group (e.g. first upper group 410*a*, second upper group 410*b*, and third upper group 410*c*) of the second plurality of trenches 405*b* is laterally and electrically isolated from the second DTC stack 414 of each other upper group, such that each upper group can represent a separate capacitor structure. In some embodiments, the DTC structure 405 may be less than 30 um away from the die 411. In some embodiments, the DTC stack 413 and the DTC stack 414 may comprise additional metal layers and additional insulating layers, such that an insulating layer separates each metal layer. In some embodiments, the first inner electrode 413*b* and the second inner electrode 414*b* may each have a first thickness ranging from 10 Angstroms to 1000 Angstroms. In some embodiments, the first outer electrode 113*d* and the second outer electrode 414*d* may each have a second thickness ranging from 10 Angstroms to 1000 Angstroms. In some embodiments, the first inner dielectric layer 413*a* and the second inner dielectric layer 414*a* may each have a third thickness ranging from 5 Angstroms to 500 Angstroms. In some embodiments, the first capacitor dielectric 413*c* and the second capacitor dielectric 414*c* may each have a fourth thickness ranging from 5 Angstroms to 500 Angstroms.

The semiconductor substrate 402 may be or otherwise comprise, for example, a bulk silicon substrate, a bulk germanium substrate, a group III-V substrate, or some other suitable semiconductor substrate. The first inner electrode 413*b*, the first outer electrode 413*d*, the second inner electrode 414*b*, and the second outer electrode 414*d* may be or otherwise comprise, for example, doped polysilicon, metal, or some other suitable conductive material(s). The first inner dielectric layer 413*a* and the second inner dielectric layer 414*a* may be or otherwise comprise, for example, silicon dioxide, silicon nitride, some other suitable low-k dielectric (s), or any combination of the foregoing. The first capacitor dielectric 413*c* and the second capacitor dielectric 414*c* may be or otherwise comprise, for example, hafnium silicate, zirconium dioxide, hafnium dioxide, some other suitable high-k dielectric(s), or any combination of the foregoing.

A metal interconnect layer 403 is stacked above the semiconductor substrate 402 such that it directly contacts a top surface of the DTC structure 405 and serves as a redistribution layer. The metal interconnect layer 403 comprises an inter-layer dielectric (ILD) 406 disposed over the DTC structure 405 and the semiconductor substrate 402. In some embodiments, a first encapsulation layer 407*a* is disposed directly over the ILD 406. In further embodiments, a second encapsulation layer 407*b* is disposed directly over the first encapsulation layer 407*a*. A through-substrate via (TSV) 404 electrically couples the metal interconnect layer 403 to the metal interconnect layer 401, such that the TSV 404 extends vertically past opposing surfaces of the semiconductor substrate 402. The second encapsulation layer

407*b* encapsulates a top surface of the TSV 404. The first encapsulation layer 407*a* lines outer sidewalls of the TSV 404. In some embodiments, the top surface of the TSV 404 is above a bottom surface of the first encapsulation layer 407*a*. Isolation structures 412*a* and 412*b* directly contact opposing outer sidewalls of the TSV 404 and laterally separate the TSV 404 from the semiconductor substrate 402. The metal interconnect layer 401 is directly coupled to the first DTC stack 413, and the metal interconnect layer 403 is directly coupled to the second DTC stack 414. In some embodiments, a metal interconnect layer 408 separates the metal interconnect layer 401 from the die 411. In some embodiments, an insulating layer 415 is disposed directly over the second encapsulation layer 407*b*. In some embodiments, the DTC structure 405 has a thickness ranging from 1 um to 500 um.

The metal interconnect layer 403, the metal interconnect layer 401, the metal interconnect layer 408, and the TSV 404 are conductive and may be or otherwise comprise, for example, tungsten, aluminum copper, copper, aluminum, some other suitable metal(s), or some other suitable conductive material(s). The ILD 406, the first encapsulation layer 407*a*, the second encapsulation layer 407*b*, and the insulating layer 415 may be or otherwise comprise, for example, silicon dioxide, silicon nitride, some other suitable low-k dielectric(s), or any combination of the foregoing. The isolation structures 412*a* and 412*b* may be or otherwise comprise, for example, undoped silicate glass, phosphosilicate glass, borophosophosilicate glass, some other suitable dielectric(s), or any combination of the foregoing.

The methodology behind the formation of previous DTC structures is complex and expensive. In order to have an optimized capacitance, the DTC structure may be vertically stacked. To vertically stack the DTC structure, the methodology may require the DTC structure to be greater than 600 um away from a die. The greater the distance between the die and the DTC structure, the greater the equivalent series resistance of the IC, causing a voltage of the IC to be more unstable. FIG. 4 illustrates a DTC structure 405 formed with a single semiconductor substrate 402, such that forming the DTC structure 405 is cheaper and simpler than the existing methodology. Further, the DTC structure 405 may be less than 30 um away from the die 411, reducing equivalent series resistance and therefore increasing voltage stability of the IC.

Figure 5:
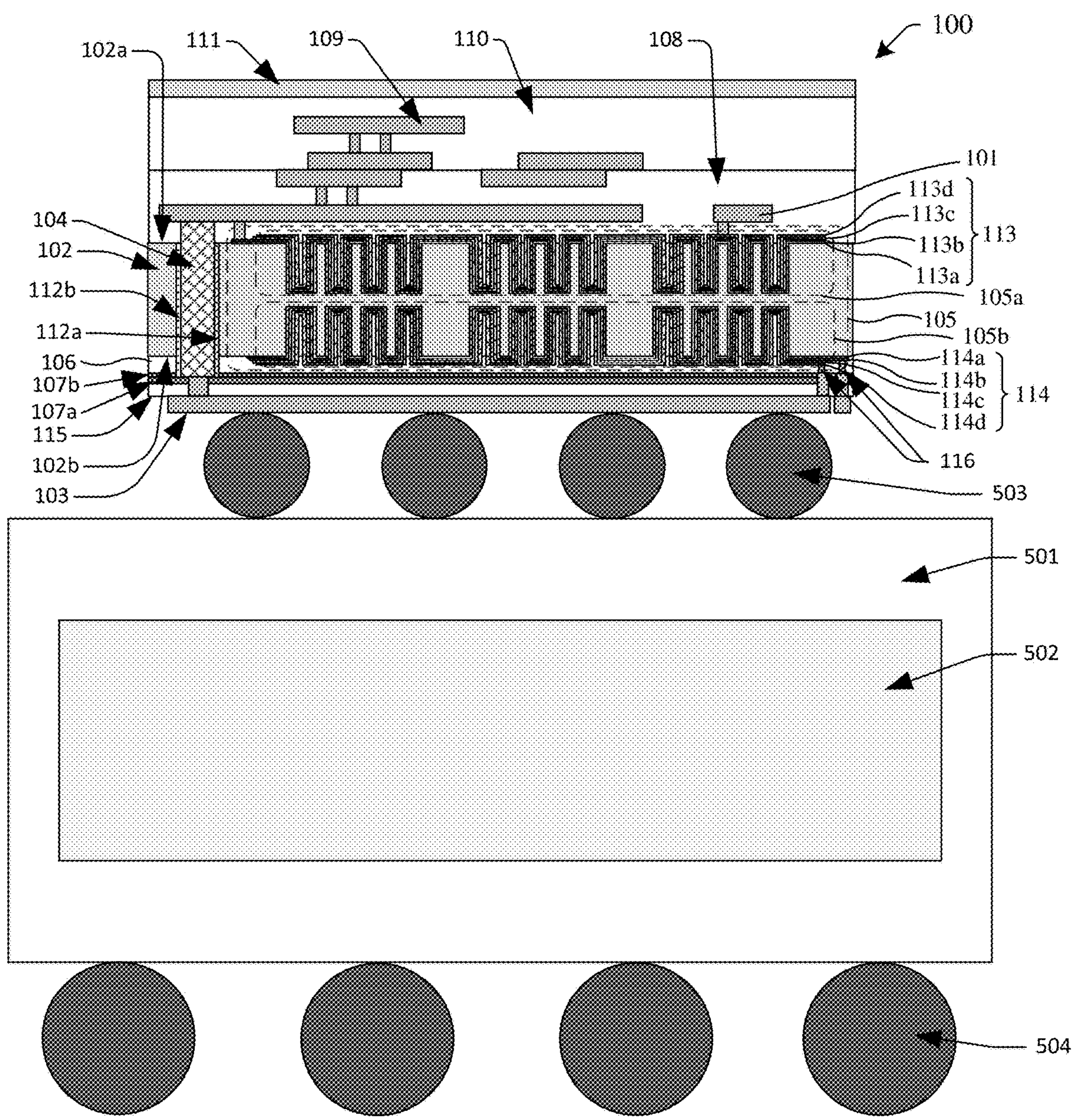
FIG. 5 illustrates a cross-sectional view of some additional embodiments of an IC comprising a stacked deep trench capacitor structure in a single substrate.

FIG. 5 illustrates a cross-sectional view 500 of some embodiments of an IC comprising a stacked deep trench capacitor structure embedded with a logic chip and coupled to a package substrate. The IC may comprise, for example, the IC of FIG. 1, illustrated by cross-sectional view 100. The IC comprises a first insulating layer 108 comprising a metal interconnect structure 101 stacked on a backside of a die 111. A semiconductor substrate 102 is disposed along a backside of the first insulating layer 108. The semiconductor substrate 102 comprises a DTC structure 105 comprising a first plurality of trenches 105*a* extending from a first side of the semiconductor substrate 102 and a second plurality of trenches 105*b* extending from a second side of the semiconductor substrate 102. Each trench of the first plurality of trenches 105*a* comprises a first DTC stack 113 configured to provide the IC with a capacitance, the first DTC stack 113 comprising a first inner dielectric layer 113*a* directly contacting the semiconductor substrate 102, a first inner electrode 113*b*, a first capacitor dielectric 113*c*, and a first outer electrode 113*d*. The first capacitor dielectric 113*c* separates the first inner electrode 113*b* from the first outer electrode 113*d*, and the first inner dielectric layer 113*a* separates the first inner electrode 113*b* from the semiconductor substrate 102. Each trench of the second plurality of trenches 105*b* comprises a second DTC stack 114 configured to provide the IC with a capacitance, the second DTC stack 114 comprising a second inner dielectric layer 114*a* directly contacting the semiconductor substrate 102, a second inner electrode 114*b*, a second capacitor dielectric 114*c*, and a second outer electrode 114*d*. The second capacitor dielectric 114*c* separates the second inner electrode 114*b* from the second outer electrode 114*d*, and the second inner dielectric layer 114*a* separates the second inner electrode 114*b* from the semiconductor substrate 102. In some embodiments, the first DTC stack 113 and the second DTC stack 114 may comprise additional metal layers and additional insulating layers, such that an insulating layer separates each metal layer.

An inter-layer dielectric (ILD) 106 is disposed along a backside of the DTC structure 105 and the semiconductor substrate 102. In some embodiments, a first encapsulation layer 107*a* is disposed directly along a backside of the ILD 106, and a second encapsulation layer 107*b* is disposed along a backside of the first encapsulation layer 107*a*. A metal interconnect structure 103 is disposed along a backside the semiconductor substrate 102 such that it directly contacts a backside surface of the DTC structure 105. A through-substrate via (TSV) 104 electrically couples the metal interconnect structure 101 to the metal interconnect structure 103, such that the TSV 104 extends vertically past opposing surfaces of the semiconductor substrate 102. The second encapsulation layer 107*b* seals a backside surface of the TSV 104, preventing exposure of the TSV 104. An insulating structure 501 surrounds a package substrate 502, and solder balls 503 couple a backside of the metal interconnect structure 103 to a frontside of the insulating structure 501. In some embodiments, a ball-grid array 504 is disposed along a backside of the insulating structure 501 to provide an electrical connection to an external device. In some embodiments, the first encapsulation layer 107*a* contacts outer sidewalls of the TSV 104, preventing exposure of the TSV 104. In some embodiments, the top surface of the TSV 104 is above a bottom surface of the first encapsulation layer 107*a*. Isolation structures 112*a* and 112*b* directly contact opposing outer sidewalls of the TSV 104 and laterally separate the TSV 104 from the semiconductor substrate 102. The metal interconnect structure 101 is directly coupled to the first DTC stack 113, and the metal interconnect structure 103 is directly coupled to the second DTC stack 114 by connecting vias 116. In some embodiments, a second insulating layer 110 comprises a metal interconnect structure 109 and separates the first insulating layer 108 from the die 111. In some embodiments, a third insulating layer 115 is disposed directly over the second encapsulation layer 107*b*. In some embodiments, the DTC structure 105 has a thickness ranging from 1 um to 500 um.

The ball-grid array 504 and the solder balls 503 are conductive and may be or otherwise comprise, for example, tungsten, aluminum copper, copper, aluminum, some other suitable metal(s), or some other suitable conductive material (s). The package substrate 502 may be or otherwise comprise, for example, ceramic, epoxy, or another suitable packaging material. The insulating structure 501 may be or otherwise comprise, for example, silicon dioxide, silicon nitride, some other suitable low-k dielectric(s), or any combination of the foregoing.

The methodology behind the formation of previous DTC structures is complex and expensive. In order to have an optimized capacitance, the DTC structure may be vertically stacked. To vertically stack the DTC structure, the methodology may require the DTC structure to be greater than 600 um away from a die. The greater the distance between the die and the DTC structure, the greater the equivalent series resistance of the IC, causing a voltage of the IC to be more unstable. FIG. 5 illustrates a DTC structure 105 that may be less than 30 um away from the die 111, reducing equivalent series resistance and therefore increasing voltage stability of the IC.

With reference to FIGS. 6A-6L, a series of cross sections 600A-600L illustrate some embodiments of a method for forming an IC comprising stacked deep trench capacitor structure. The IC may, for example, correspond to the IC of FIG. 1.

Figure 6A:
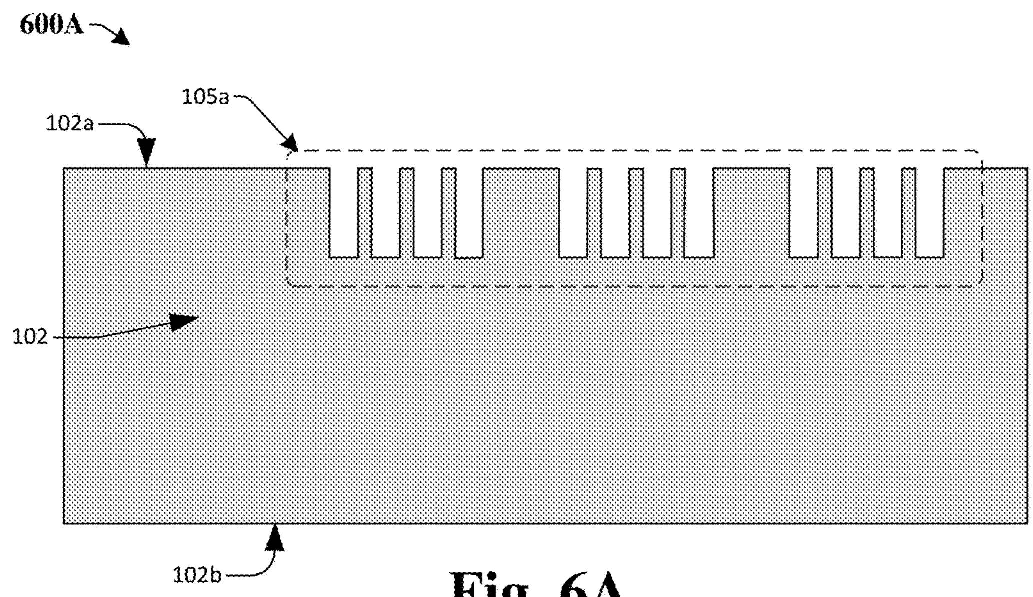
FIGS. 6A-6L illustrate a series of cross-sectional views for a method of forming an IC comprising a stacked deep trench capacitor structure in a single wafer.

As illustrated by the cross-sectional view 600A of FIG. 6A, a semiconductor substrate 102 is prepared including a first side 102*a* and a second side 102*b*. A hard mask is disposed over the first side 102*a* of the semiconductor substrate 102, and a first plurality of trenches 105*a* are etched into the first side 102*a* of the semiconductor substrate 102. A removal process then removes the remaining hard mask. The removal process may be or otherwise comprise, for example, a Si dry etch, an alkali wet etch, or some other suitable removal process. The semiconductor substrate 102 may be or otherwise comprise, for example, a bulk silicon substrate, a bulk germanium substrate, a group III-V substrate, or some other suitable semiconductor substrate.

Figure 6B:
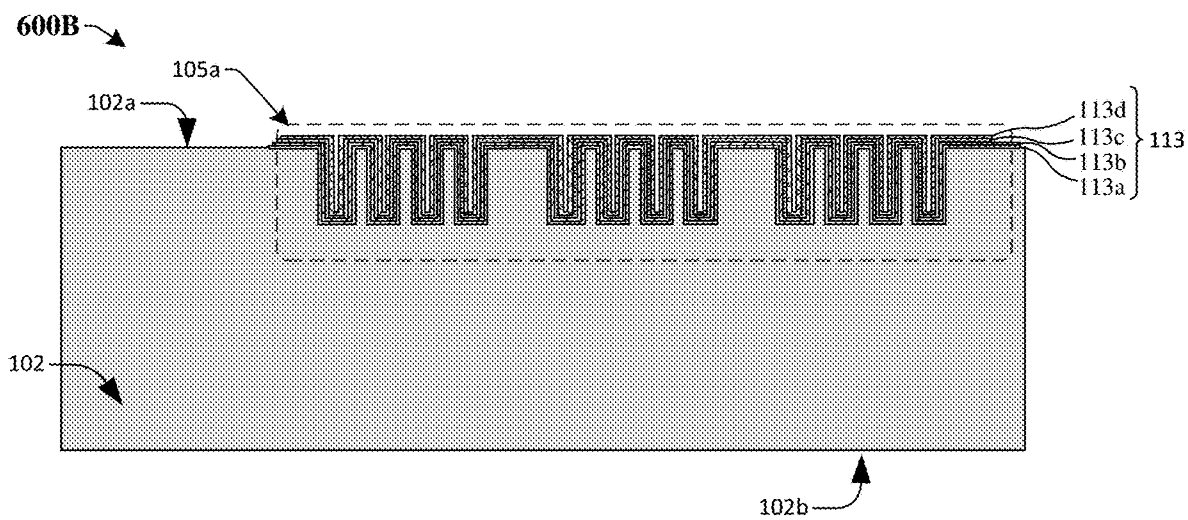

As illustrated by the cross-sectional view 600B of FIG. 6B, a first DTC stack 113 is formed within the first plurality of trenches 105*a*. Forming the first DTC stack 113 comprises forming a first inner dielectric layer 113*a* within the first plurality of trenches 105*a* and over the first side 102*a* of the semiconductor substrate 102. Then, a first inner electrode 113*b* is formed within the first plurality of trenches 105*a* and over the first inner dielectric layer 113*a*. In some embodiments, a lithography process etching process is then done on the first inner electrode 113*b* to laterally offset an outer edge of the first inner electrode 113*b* from an outer edge of the first inner dielectric layer 113*a*. Then, a first capacitor dielectric 113*c* is formed within the first plurality of trenches 105*a* and over the first inner electrode 113*b*. In some embodiments, an etching process is then done on the capacitor dielectric 113*c* to laterally offset an outer edge of the capacitor dielectric 113*c* from the outer edge of the first inner electrode 113*b* and the outer edge of the first inner dielectric layer 113*a*. Then, a first outer electrode 113*d* is formed within the first plurality of trenches 105*a* and over the first capacitor dielectric 113*c*. In some embodiments, an etching process is then done on the first outer electrode 113*d* to laterally offset an outer edge of the first outer electrode 113*d* from the outer edge of the capacitor dielectric 113*c*, the outer edge of the first inner electrode 113*b*, and the outer edge of the first inner dielectric layer 113*a*. The first DTC stack 113 may be formed by chemical vapor deposition, physical vapor deposition, electroplating, atomic-layer deposition, another suitable formation process, or any combination of the foregoing.

Figure 6C:
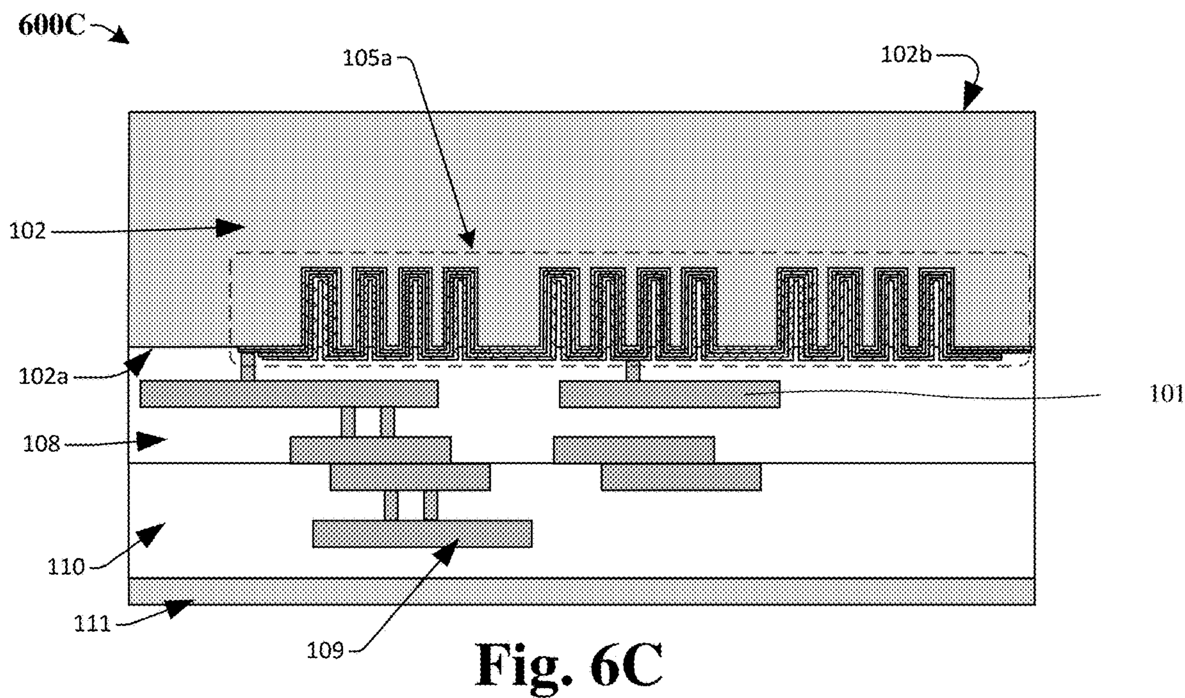

As illustrated by the cross-sectional view 600C of FIG. 6C, a metal interconnect structure 101 is formed within a first insulating layer 108 along the first side 102*a* of the semiconductor substrate 102 and is in contact with the first DTC stack 113. The metal interconnect structure 101 and the first insulating layer 108 may be formed by a lithography process. The second side 102*b* of the semiconductor substrate 102 then undergoes a thin down process. In some embodiments, a second insulating layer 110 comprising a metal interconnect structure 109 and stacked above a die 111 is bonded to the first insulating layer 108 by a bonding process, separating the die 111 from the first insulating layer 108. The bonding process may be or otherwise comprise a hybrid bond, a fusion bond, or some other suitable bonding process. The thin down process may be or otherwise comprise, for example, grinding, a Si dry etch, an alkali wet etch, a chemical-mechanical planarization process, some other suitable thin down process, or any combination of the foregoing.

Figure 6D:
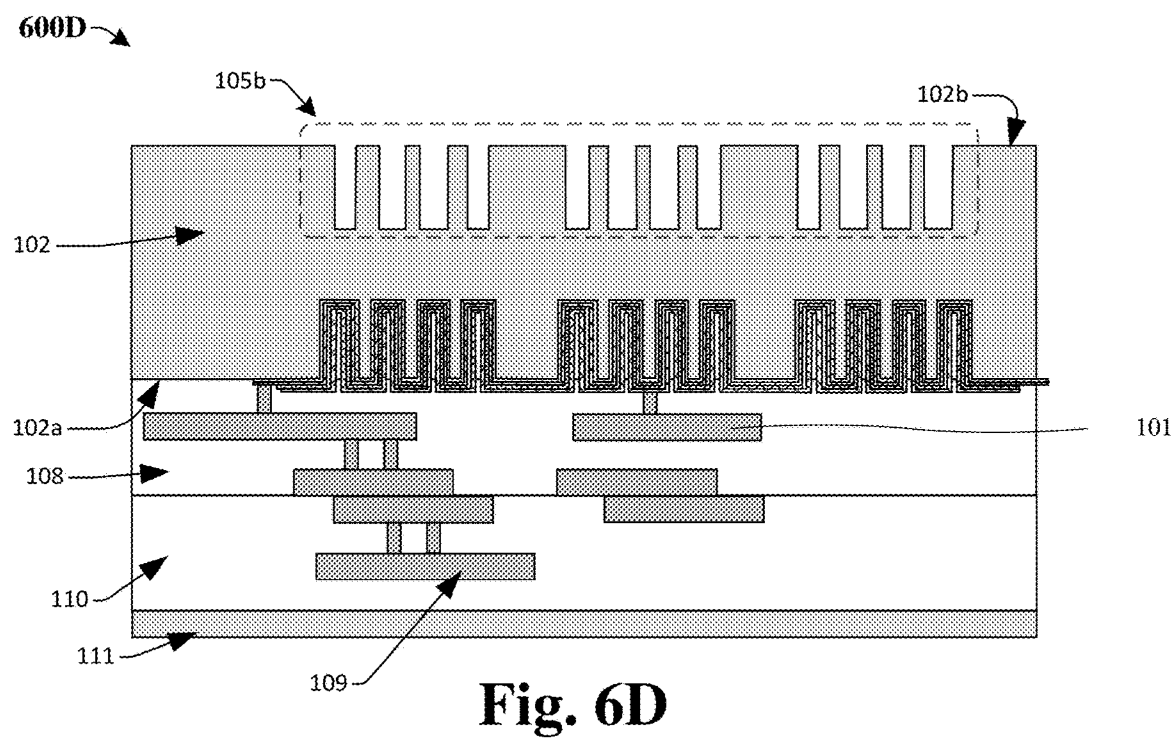

As illustrated by the cross-sectional view 600D of FIG. 6D, a hard mask is disposed over the second side 102*b* of the semiconductor substrate 102, and a second plurality of trenches 105*b* are etched into the second side 102*b* of the semiconductor substrate 102. A removal process then removes the remaining hard mask. The removal process may be or otherwise comprise, for example, a Si dry etch, an alkali wet etch, or some other suitable removal process.

Figure 6E:
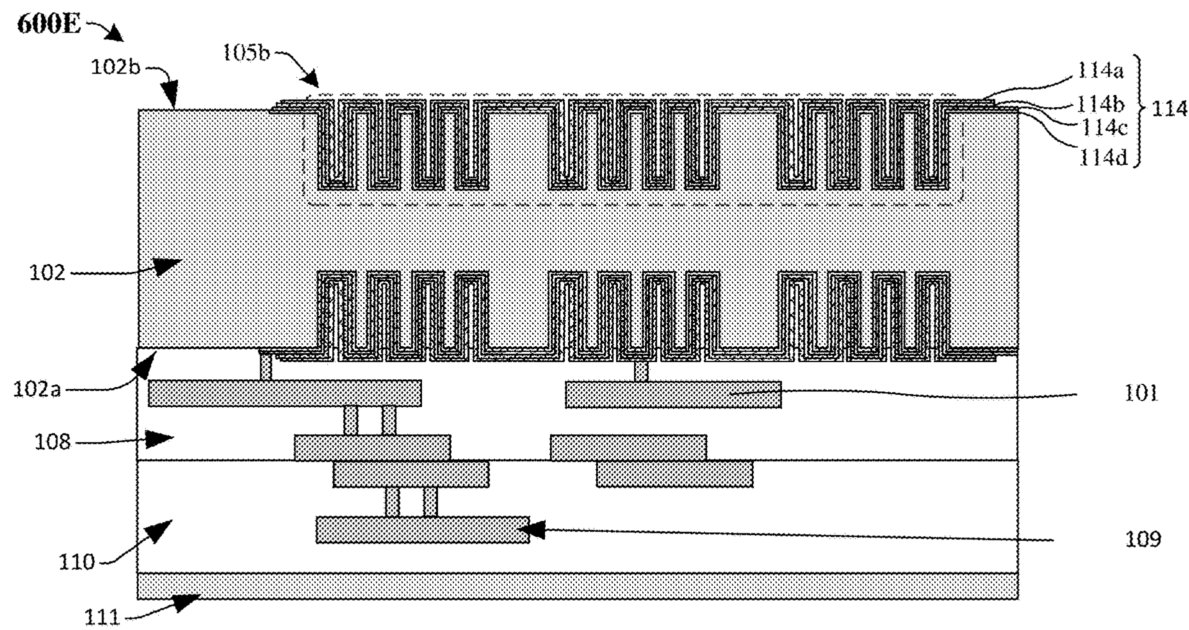

As illustrated by the cross-sectional view 600E of FIG. 6E, a second DTC stack 114 is formed within the second plurality of trenches 105*b*. Forming the second DTC stack 114 comprises forming a second inner dielectric layer 114*a* within the second plurality of trenches 105*b* and over the second side 102*b* of the semiconductor substrate 102. Then, a second inner electrode 114*b* is formed within the second plurality of trenches 105*b* and over the second inner dielectric layer 114*a*. Then, a second capacitor dielectric 114*c* is formed within the second plurality of trenches 105*b* and over the second inner electrode 114*b*. Then, a second outer electrode 114*d* is formed within the second plurality of trenches 105*b* and over the second capacitor dielectric 114*c*. The second DTC stack 114 may be formed by chemical vapor deposition, physical vapor deposition, electroplating, atomic-layer deposition, another suitable formation process, or any combination of the foregoing.

Figure 6F:
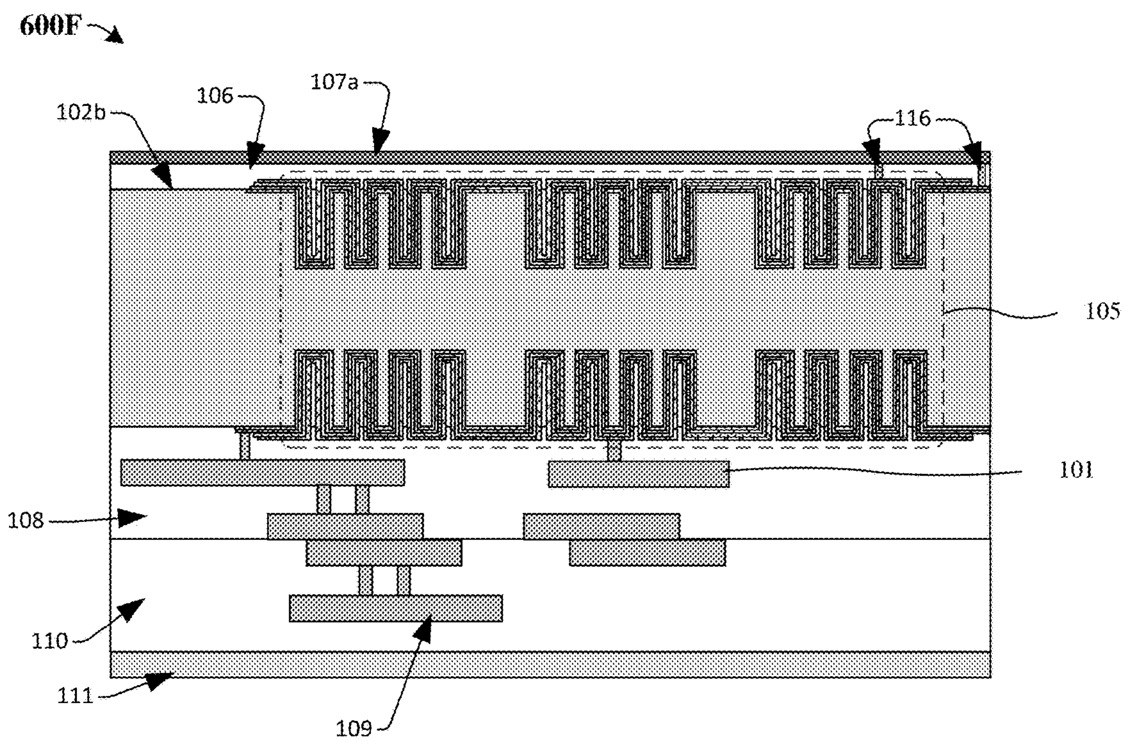

As illustrated by the cross-sectional view 600F of FIG. 6F, an inter-layer dielectric (ILD) 106 is formed over the second side 102*b* of the semiconductor substrate 102, and connecting vias 116 are formed within the ILD 106 and are coupled to the second DTC stack 114. A first encapsulation layer 107*a* is formed over the ILD 106.

Figure 6G:
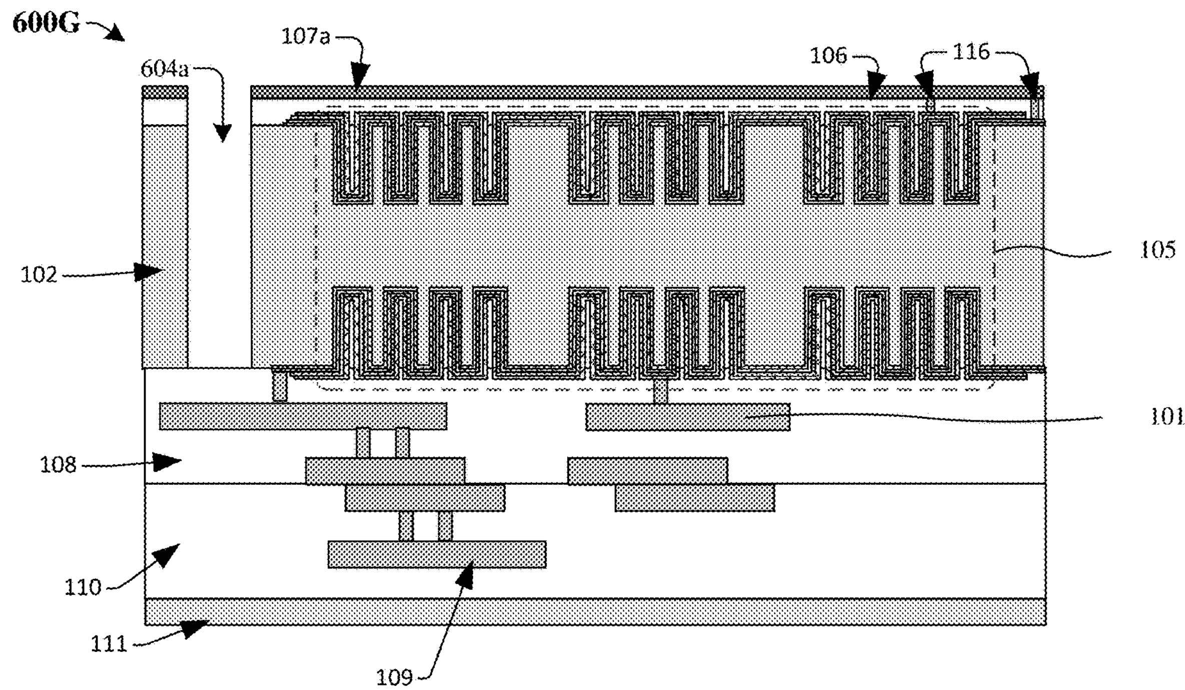

As illustrated by the cross-sectional view 600G of FIG. 6G, a hard mask is formed over a top surface of the first encapsulation layer 107*a*. A first trench 604*a* is etched into the first encapsulation layer 107*a*, ILD 106, and the semiconductor substrate 102. The first trench 604*a* extends from a top surface of the first encapsulation layer 107*a* to a top surface of the first insulating layer 108, such that a portion of the first insulating layer 108 is exposed. A removal process then removes the remaining hard mask. The removal process may be or otherwise comprise, for example, a Si dry etch, an alkali wet etch, or some other suitable removal process.

Figure 6H:
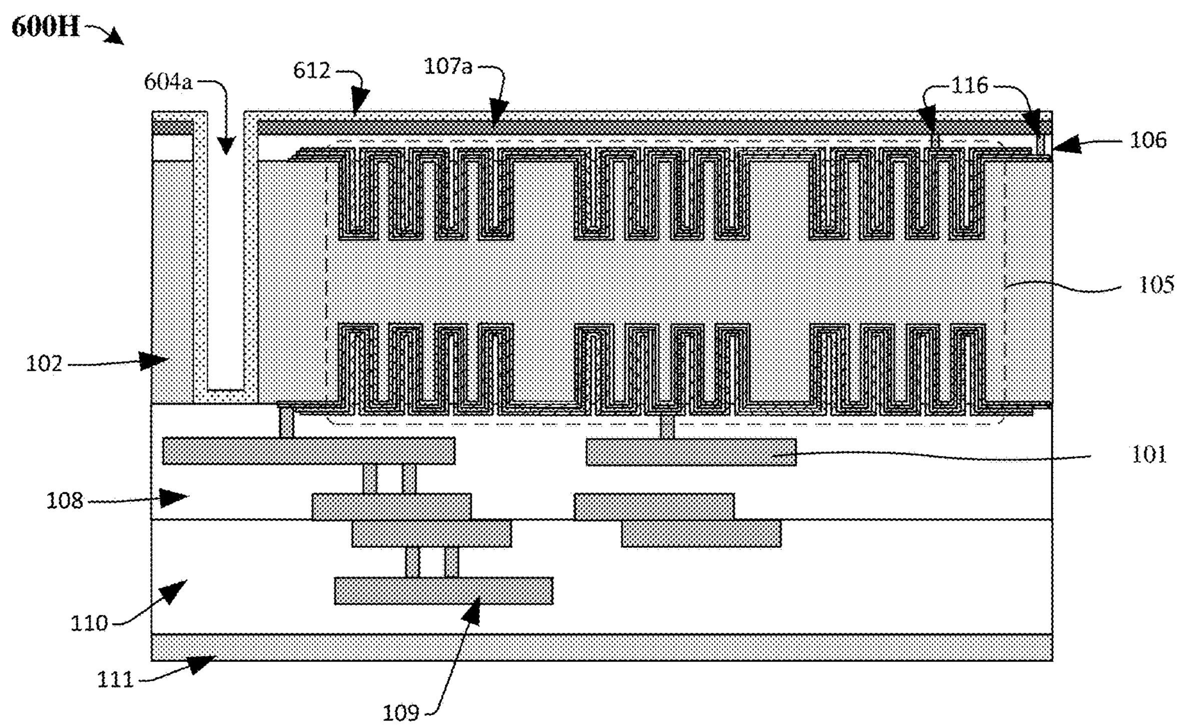

As illustrated by the cross-sectional view 600H of FIG. 6H, a dielectric layer 612 is formed over a top surface of the ILD 106 and within the first trench 604*a* such that the dielectric layer 612 is formed along inner sidewalls of the first encapsulation layer 107*a* along inner sidewalls of the ILD 106, along inner sidewalls of the semiconductor substrate 102, and over the exposed portion of the first insulating layer 108. The formation process for the dielectric layer 612 may be or otherwise comprise, for example, chemical vapor deposition, physical vapor deposition, sputtering, or some other suitable formation process. The dielectric layer 612 may be or otherwise comprise, for example, an oxide (e.g. silicon dioxide), some other suitable dielectric(s), or any combination of the foregoing.

Figure 6I:
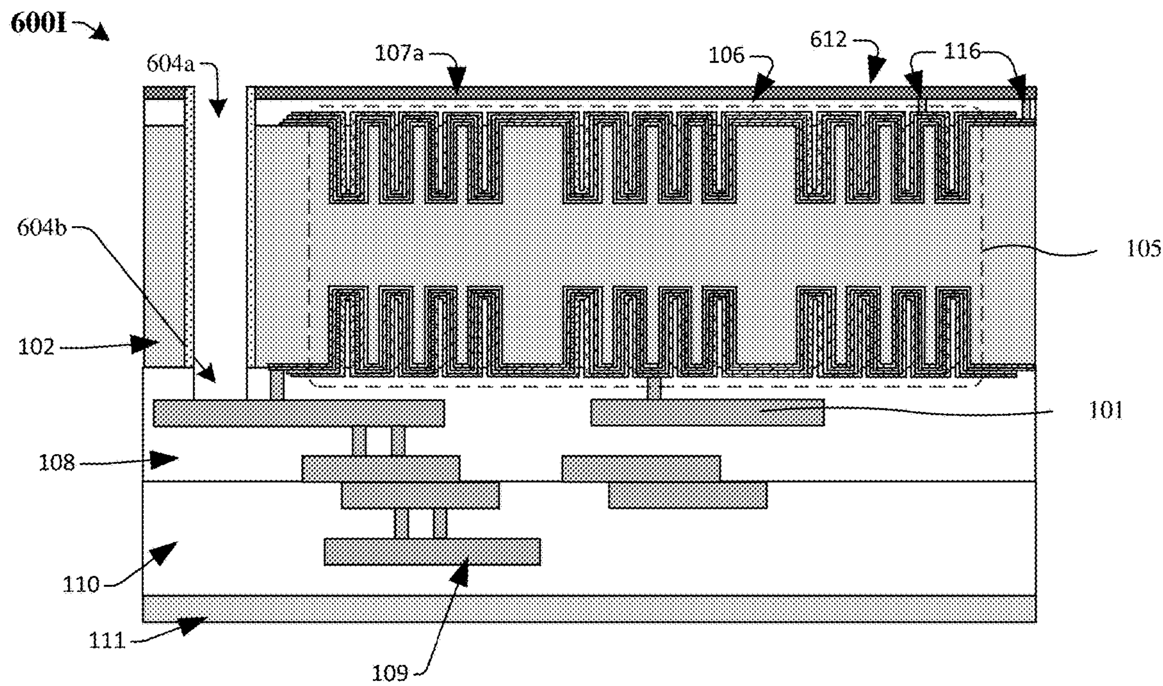

As illustrated by the cross-sectional view 600I of FIG. 6I, a second trench 604*b* is etched into the ILD 106 and the semiconductor substrate 102. The second trench 604*b* extends from a top surface of the first insulating layer 108 to a top surface of the metal interconnect structure 101, such that a portion of the metal interconnect structure 101 is exposed. In some embodiments, the etch removes all laterally extending portions of the dielectric layer 612.

Figure 6J:
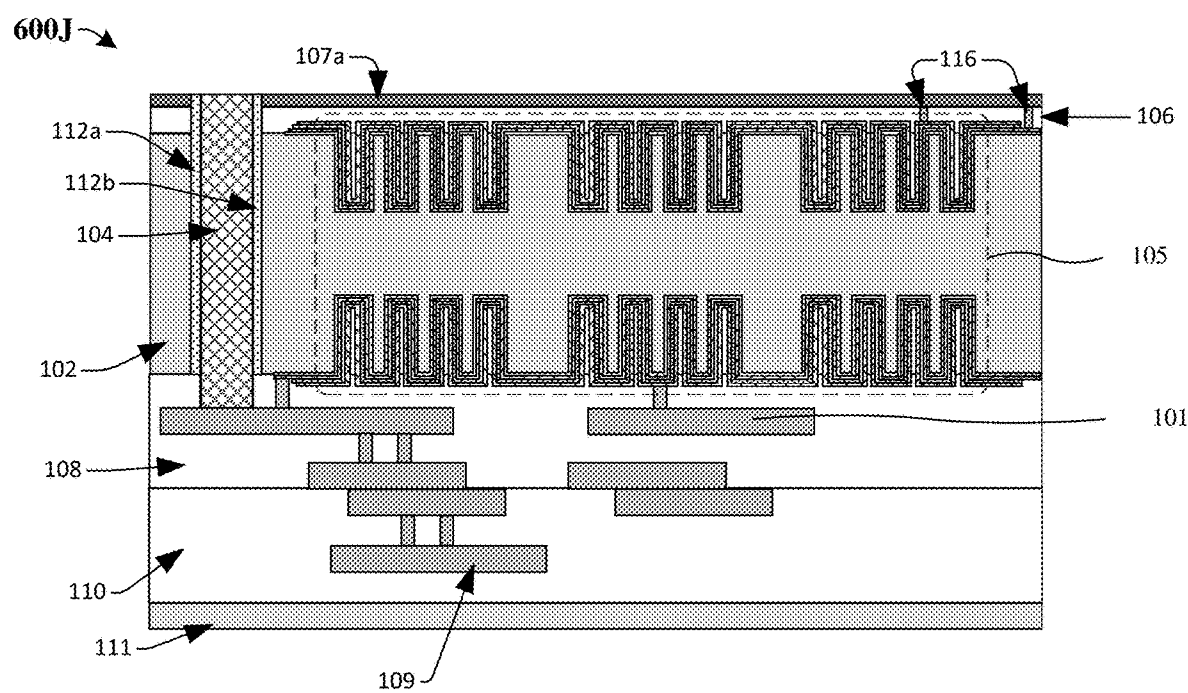

As illustrated by the cross-sectional view 600J of FIG. 6J, a through-substrate via (TSV) 104 is formed within the first trench 604*a* and the second trench 604*b*. The remaining portions of the dielectric layer 612 serve as isolation structures 112*a* and 112*b* to laterally separate the TSV 104 from the semiconductor substrate 102. In some embodiments, a top surface of the TSV 104 is above a top surface of the ILD 106. In some embodiments, a thin down process is done on the TSV 104. The TSV 104 may be formed by chemical vapor deposition, physical vapor deposition, electroplating, atomic-layer deposition, another suitable formation process, or any combination of the foregoing. The thin down process may be or otherwise comprise, for example, grinding, a Si dry etch, an alkali wet etch, a chemical-mechanical planarization process, some other suitable thin down process, or any combination of the foregoing.

Figure 6K:
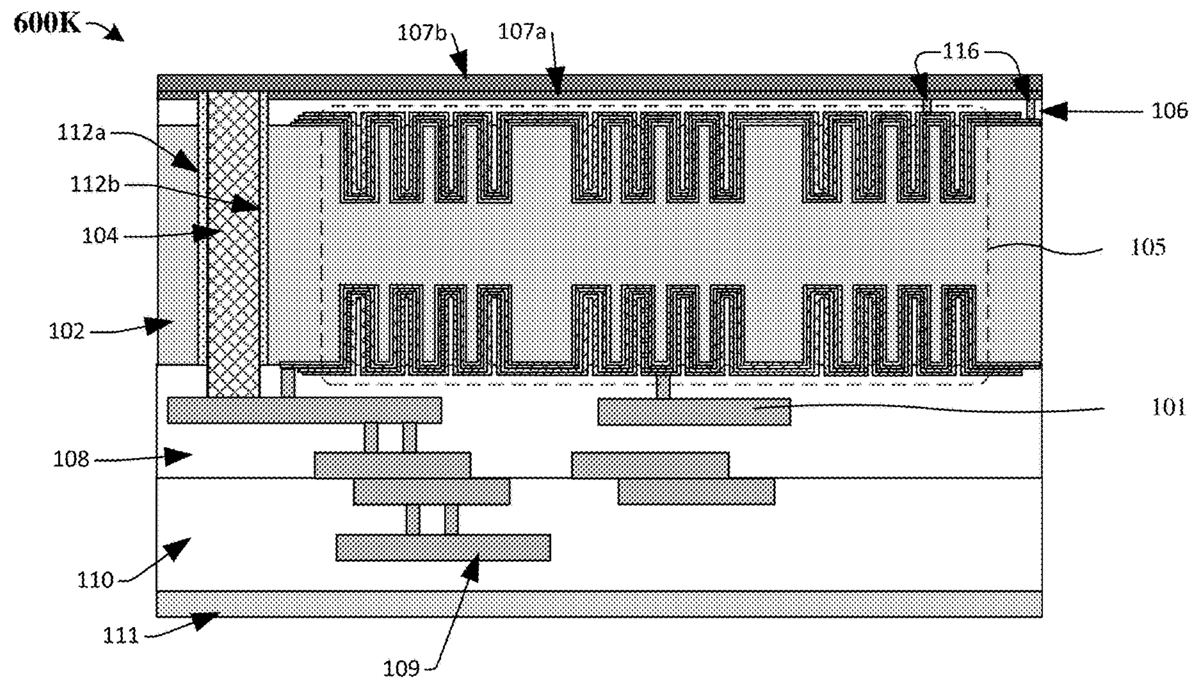

As illustrated by the cross-sectional view 600K of FIG. 6K, a second encapsulation layer 107*b* is formed over the first encapsulation layer 107*a* and the TSV 104. In some embodiments, a bottom surface of the second encapsulation layer 107*b* is above a top surface of the TSV 104. In some embodiments, a top surface of the TSV 104 is above a bottom surface of the first encapsulation layer 107*a*.

Figure 6L:
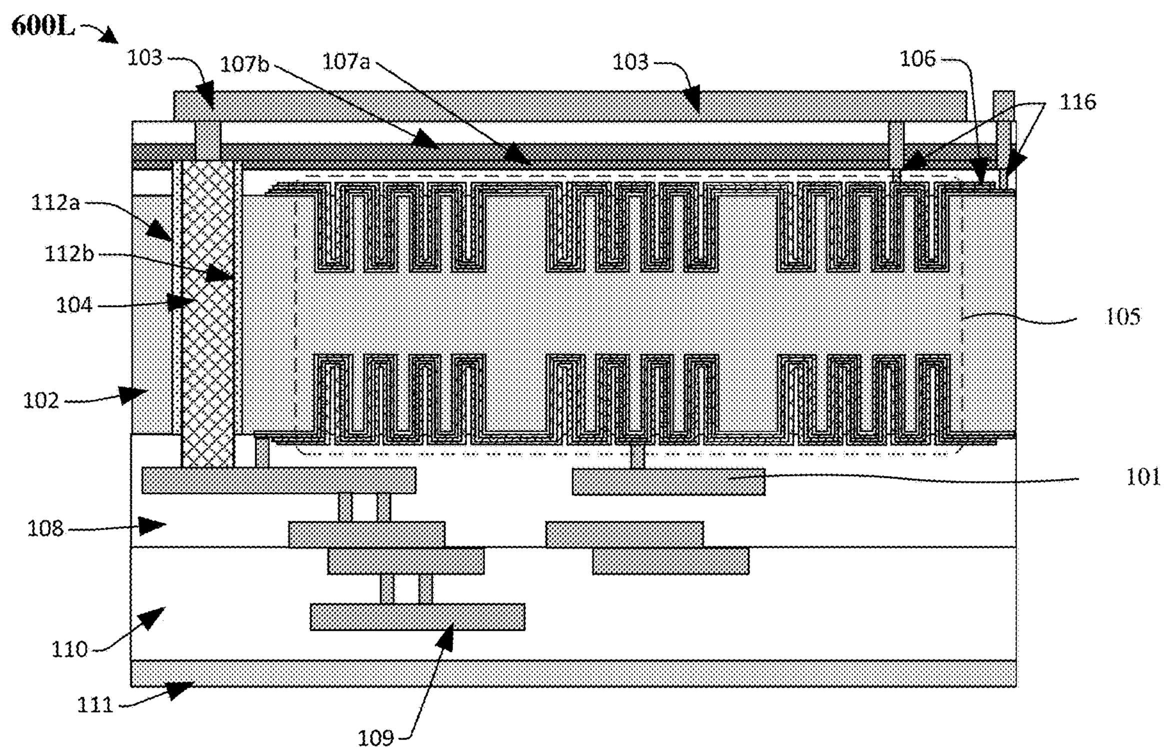

As illustrated by the cross-sectional view 600L of FIG. 6L, a metal interconnect structure 103 is formed over and within the ILD 106, the encapsulation layer 107, and the TSV 104, such that the metal interconnect structure 103 contacts the connecting vias 116 and the TSV 104. The TSV 104 electrically couples the metal interconnect structure 101 to the metal interconnect structure 103, and the metal interconnect structure 103 serves as a redistribution layer. In some embodiments, a third insulating layer 115 is formed above the second encapsulation layer 107*b* prior to forming the metal interconnect structure 103.

Figure 7:
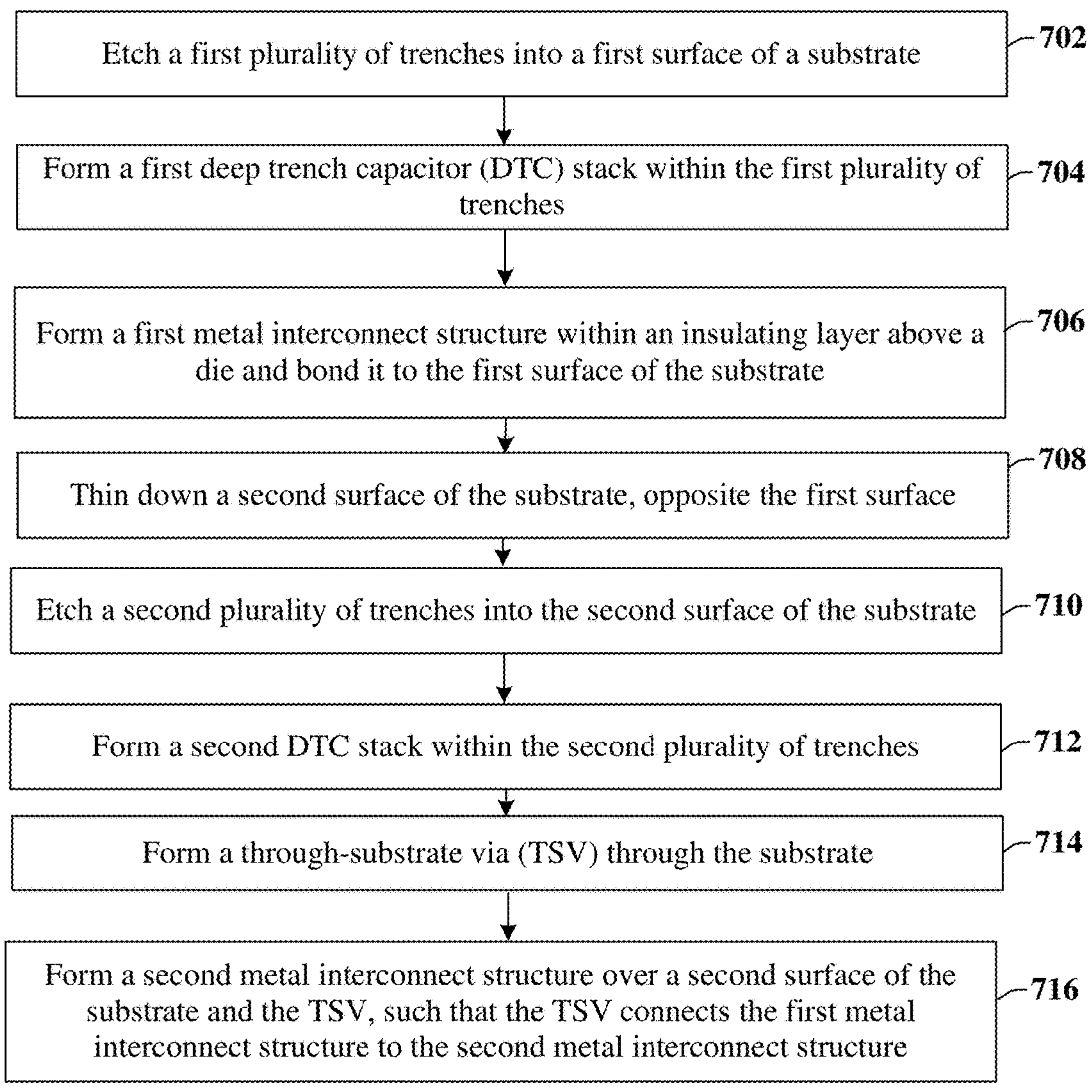
FIG. 7 illustrates a flowchart of some embodiments of the method consistent with FIGS. 6A-6L.

With respect to FIG. 7, a flowchart 700 of some embodiments of a method for forming an IC comprising stacked deep trench capacitor structure. The IC may, for example, correspond to the IC of FIGS. 6A-6L.

At 702, a first plurality of trenches is etched into a first surface of a semiconductor substrate. See, for example, FIG. 6A.

At 704, a first deep trench capacitor (DTC) stack is formed within the first plurality of trenches. See, for example, FIG. 6B.

At 706, a first metal interconnect structure is formed within an insulating layer above a die and bonded to the first surface of the semiconductor substrate. See, for example, FIG. 6C.

At 708, a second surface of the semiconductor substrate opposite the first surface is thinned down. See, for example, FIG. 6C.

At 710, a second plurality of trenches is etched into the second surface of the semiconductor substrate. See, for example, FIG. 6D.

At 712, a second DTC stack is formed within the second plurality of trenches. See, for example, FIG. 6E.

At 714, a through-substrate via (TSV) is formed through the semiconductor substrate. See, for example, FIG. 6J.

At 716, a second metal interconnect structure is formed over a second surface of the semiconductor substrate and the TSV, such that the TSV connects the first metal interconnect structure to the second metal interconnect structure. See, for example, FIG. 6L.

Accordingly, in some embodiments, the present disclosure relates to an integrated circuit (IC), including a first insulating layer which includes a first metal interconnect structure stacked above a bottom die. Including a substrate disposed above the first insulating layer, a second metal interconnect structure disposed above the substrate, a through-substrate via (TSV) directly connecting the first metal interconnect structure to the second metal interconnect structure, and a stacked deep trench capacitor (DTC) structure disposed in the substrate. The DTC structure includes a first plurality of trenches extending from a first side of the substrate and a second plurality of trenches extending from a second side of the substrate.

In other embodiments, the present disclosure relates to a method for building an integrated circuit (IC), including forming a first series of trenches on a first side of a substrate, and forming a first deep trench capacitor (DTC) stack within the first series of trenches. Also, after the first DTC stack has been formed, the method includes bonding the first side of the substrate to a first metal interconnect structure disposed on a carrier wafer, thinning down a second side of the substrate opposite the first side, etching a second series of trenches into the second side of the substrate, and forming a second DTC stack within the second series of trenches.

In yet other embodiments, the present disclosure relates to an integrated circuit (IC), including a first metal interconnect layer above a first substrate. Including a second substrate with a first surface bonded to the first metal interconnect layer, a second metal interconnect layer above the second substrate, a through-substrate via (TSV) directly connecting the first metal interconnect layer to the second metal interconnect layer, and a deep trench capacitor (DTC) structure disposed in the second substrate. The DTC structure includes one or more upper groups of one or more upper trenches extending from an upper side of the second substrate and one or more lower groups of one or more lower trenches extending from a lower side of the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:

a first insulating layer comprising a first metal interconnect structure stacked above a bottom die;

a substrate disposed above the first insulating layer;

a second metal interconnect structure disposed above the substrate;

a through-substrate via (TSV) directly connecting the first metal interconnect structure to the second metal interconnect structure, wherein a width of the TSV covers the first insulating layer; and a stacked deep trench capacitor (DTC) structure disposed in the substrate comprising a first plurality of trenches extending from a first side of the substrate, and a second plurality of trenches extending from a second side of the substrate;

wherein the first plurality of trenches includes a first group of trenches and a second group of trenches, wherein an outermost edge of the first group of trenches and an outermost edge of the second group of trenches nearest to the outermost edge of the first group of trenches are spaced apart from one another by a first distance, and wherein each of the first group of trenches and the second group of trenches comprise a plurality of trenches that are spaced from one another by a second distance smaller than the first distance; and wherein the DTC structure includes an inner electrode, an outer electrode, and a dielectric layer that extend continuously from over the first group of trenches to over the second group of trenches, the dielectric layer separating the inner electrode from the outer electrode.

2. The IC according to claim 1, further comprising:

an inter-layer dielectric disposed over the substrate, directly contacting outer sidewalls of the TSV; and an encapsulation layer disposed directly over the inter-layer dielectric.

3. The IC according to claim 1, wherein the second metal interconnect structure directly contacts an upper surface of the stacked DTC structure.

4. The IC according to claim 1, wherein the substrate continuously extends from the first plurality of trenches to the second plurality of trenches.

5. The IC according to claim 1, wherein the stacked DTC structure has a thickness ranging from 1um to 500um.

6. An integrated circuit (IC), comprising:

a first plurality of groups of trenches on a first side of a substrate, wherein each group of trenches in the first plurality of groups of trenches is spaced from nearest neighboring groups of trenches in the first plurality of groups of trenches by a first distance, and wherein each group of the first plurality of groups of trenches comprises a plurality of trenches spaced from one another by a second distance smaller than the first distance;

a first deep trench capacitor (DTC) stack arranged within the first series plurality of groups of trenches;

a carrier wafer including a first metal interconnect structure bonded to the first side of the substrate;

a second series plurality of groups of trenches on a second side of the substrate, wherein each group of trenches in the second plurality of groups of trenches is spaced from nearest neighboring groups of trenches in the second plurality of groups of trenches by the first distance, and wherein each group of the second plurality of groups of trenches comprises a plurality of trenches spaced from one another by the second distance;

a second DTC stack within the second series plurality of groups of trenches;

a through-substrate via (TSV) through the substrate; and a second metal interconnect structure over the second side of the substrate and over the TSV, wherein the TSV connects the first metal interconnect structure to the second metal interconnect structure, and wherein the first plurality of groups of trenches, the second series plurality of groups of trenches, and the TSV directly underlie a linear portion of the second metal interconnect structure that extends continuously from over a first group of trenches in the first plurality of groups, over a second group of trenches in the first plurality of groups, to over a third group of trenches in the first plurality of groups.

7. The IC of claim 6, further comprising an inter-layer dielectric over the first side of the substrate and separating the second metal interconnect structure from the substrate.

8. The IC of claim 7, wherein the inter-layer dielectric directly contacts outer sidewalls of the TSV.

9. The IC according to claim 6, wherein a distance as measured perpendicularly from the first side of the substrate to the second side of the substrate ranges from 1 um to 500 um.

10. The IC of claim 6, wherein the first and second DTC stacks comprise:

an inner dielectric layer directly contacting the substrate and comprising a pair of continuous portions over the first and second plurality of groups of trenches, respectively;

an inner electrode comprising a pair of continuous portions along the pair of continuous portions of the inner dielectric layer;

a capacitor dielectric comprising a pair of continuous portion along the pair of continuous portions of the inner electrode; and an outer electrode comprising a pair of continuous portions along the pair of continuous portions of the capacitor dielectric and separated from the inner electrode by the capacitor dielectric.

11. The IC of claim 6, wherein the first plurality of groups of trenches and the second plurality of groups of trenches have an equal number of trenches.

12. An integrated circuit (IC), comprising:

a first metal interconnect structure;

a substrate disposed above the first metal interconnect structure;

a second metal interconnect structure disposed above the substrate;

a through-substrate via (TSV) contacting the first metal interconnect structure and the second metal interconnect structure; and a stacked deep trench capacitor (DTC) structure disposed in the substrate and comprising: a first plurality of groups of trenches, each group laterally spaced from one another by a first distance and extending from a first side of the substrate, and a second plurality of groups of trenches, each group laterally spaced from one another by the first distance and extending from a second side of the substrate;

wherein each group of the first plurality of groups of trenches and each group of the second plurality of groups of trenches comprises a plurality of trenches laterally spaced by a second distance less than the first distance, and wherein outer edges of the first plurality of groups of trenches are laterally aligned with outer edges of the second plurality of groups of trenches; and wherein an upper surface of the TSV overlies an uppermost surface of the DTC structure, and wherein a lower surface of the TSV underlies a lowermost surface of the DTC structure.

13. The IC of claim 12, wherein the first plurality of groups of trenches comprises a continuous inner electrode, a continuous outer electrode, and a continuous dielectric layer shared by each trench in the first plurality of groups of trenches, the continuous dielectric layer separating the continuous outer electrode from the continuous inner electrode.

14. The IC of claim 13, wherein an upper lateral portion of the continuous inner electrode of the first plurality of groups of trenches overlies an outermost surface of the first side of the substrate.

15. The IC of claim 13, wherein the continuous outer electrode of the first plurality of groups of trenches contacts the second metal interconnect structure.

16. The IC of claim 15, wherein the second plurality of groups of trenches comprises a continuous inner electrode, a continuous outer electrode, and a continuous dielectric layer shared by each trench in the second plurality of groups of trenches, wherein the continuous dielectric layer separates the continuous outer electrode from the continuous inner electrode, and wherein the continuous inner electrode of the second plurality of groups of trenches contacts the first metal interconnect structure.

17. The IC of claim 1, wherein the first plurality of trenches further comprises:

a third group of trenches, wherein the second group of trenches is arranged laterally between the first group of trenches and the third group of trenches;

wherein an outermost edge of the third group of trenches and an outermost edge of the second group of trenches nearest to the outermost edge of the third group of trenches are spaced apart from one another by the first distance and wherein the inner electrode, the outer electrode, and the dielectric layer extend continuously from over the second group of trenches to over the third group of trenches.

18. The IC of claim 1, wherein sidewalls of each of the first plurality of trenches are aligned with sidewalls of each of the second plurality of trenches.

19. The IC of claim 6, wherein outermost sidewalls of each group of the first plurality of groups of trenches are aligned with outermost sidewalls of each group of the second plurality of groups of trenches.

20. The IC of claim 12, wherein outermost sidewalls of each group of the first plurality of groups of trenches are aligned with outermost sidewalls of each group of the second plurality of groups of trenches.

* * * * *